United States Patent
Jiang et al.

(10) Patent No.: US 9,099,122 B2
(45) Date of Patent: Aug. 4, 2015

(54) SCISSOR SENSOR WITH BACK EDGE BIAS STRUCTURE AND NOVEL DIELECTRIC LAYER

(71) Applicant: HGST Netherlands B.V., Amsterdam (NL)

(72) Inventors: Hongquan Jiang, San Jose, CA (US); Quang Le, San Jose, CA (US); Thao Pham, San Jose, CA (US); David J. Seagle, Morgan Hill, CA (US); Hicham M. Sougrati, Elk Grove, CA (US); Petrus A. Van Der Heijden, Cupertino, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/094,690

(22) Filed: Dec. 2, 2013

(65) Prior Publication Data
US 2015/0154990 A1    Jun. 4, 2015

(51) Int. Cl.
*G11B 5/39* (2006.01)

(52) U.S. Cl.
CPC ............... *G11B 5/3903* (2013.01); *G11B 5/39* (2013.01); *G11B 5/3906* (2013.01); *G11B 5/398* (2013.01); *G11B 5/3932* (2013.01); *G11B 2005/3996* (2013.01)

(58) Field of Classification Search
CPC ............ G11B 5/33; G11B 5/332; G11B 5/39; G11B 5/3903; G11B 5/3906; G11B 5/3912; G11B 5/3932; G11B 2005/3996
USPC ......... 360/319, 324.1, 324.11, 324.12, 324.2, 360/320
See application file for complete search history.

(56) References Cited

U.S. PATENT DOCUMENTS

| | | | |
|---|---|---|---|
| 5,818,685 A | 10/1998 | Thayamballi et al. | |
| 7,061,725 B2 | 6/2006 | Seigler | |
| 7,436,632 B2 | 10/2008 | Li et al. | |
| 8,077,436 B2 * | 12/2011 | Hirata et al. | 360/324.12 |
| 8,136,226 B2 | 3/2012 | Gill et al. | |
| 8,233,248 B1 | 7/2012 | Li et al. | |

(Continued)

FOREIGN PATENT DOCUMENTS

JP    2005339781    12/2005

OTHER PUBLICATIONS

Saito, M., et al., "Narrow Track Current-Perpendicular-To-Plane Spin Valve GMR Heads," IEEE Transactions on Magnetics, vol. 40, No. 1, Jan. 2004, pp. 207-212.

*Primary Examiner* — Jefferson Evans
(74) *Attorney, Agent, or Firm* — Zilka-Kotab, PC

(57) ABSTRACT

A scissor type magnetic sensor having an improved back edge bias structure. The back edge bias structure extends beyond the sides of the sensor stack for improved bias moment and is formed on a flat topography that provide for improved magnetic biasing. The sensor is formed by a method that includes first defining a sensor width and then depositing a multi-layer insulation layer that includes a dielectric layer that is resistant to ion milling and the depositing a fill layer over the dielectric layer that is removable by ion milling. After the multi-layer insulation layer has been deposited the back edge (i.e. stripe height) of the sensor is formed by masking and ion milling. This ion milling removes portions of the non-magnetic, electrically insulating fill layer that extend beyond the stripe height and beyond the sides of the sensor, leaving the dielectric layer there-beneath.

9 Claims, 29 Drawing Sheets

(56) References Cited

U.S. PATENT DOCUMENTS

| | | | |
|---|---|---|---|
| 8,472,149 B2* | 6/2013 | Hara et al. | 360/324 |
| 8,604,573 B2* | 12/2013 | Yamakawa et al. | 257/421 |
| 8,670,218 B1* | 3/2014 | Zeltser et al. | 360/324.2 |
| 8,749,926 B1* | 6/2014 | Le et al. | 360/324.12 |
| 2005/0063100 A1 | 3/2005 | Kautzky et al. | |
| 2006/0232893 A1* | 10/2006 | Gill et al. | 360/324.12 |
| 2009/0166331 A1 | 7/2009 | Marley | |
| 2012/0214020 A1 | 8/2012 | Chou et al. | |
| 2012/0231296 A1 | 9/2012 | Le et al. | |

* cited by examiner

SCISSOR SENSOR WITH BACK EDGE BIAS STRUCTURE AND NOVEL DIELECTRIC LAYER

FIELD OF THE INVENTION

The present invention relates to magnetic data recording and more particularly to a scissor type magnetic sensor having a magnetic bias structure formed at its back edge and for a method for forming such a sensor.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresisive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the size of a magnetic read sensor. With regard to linear data density along a data track, this means reducing the gap thickness of a magnetic sensor. Currently used sensors, such as the GMR and TMR sensors discussed above, typically require 4 magnetic layers, 3 ferromagnetic (FM) and 1 antiferromagnetic (AFM) layer, along with additional nonmagnetic layers. Only one of the magnetic layers serves as the active (or free) sensing layer. The remaining "pinning" layers, while necessary, nonetheless consume a large amount of gap thickness. One way to overcome this is to construct a sensor as a "scissor" sensor that uses only two magnetic "free" layers without additional pinning layers, thus potentially reducing gap thickness to a significant degree. However, the use of such a magnetic sensor results in design and manufacturing challenges. One challenge presented by such as structure regards proper magnetic biasing of the two free layers of the sensor.

SUMMARY OF THE INVENTION

The present invention provides a magnetic sensor that includes a sensor stack having a front edge located at an air bearing surface a back edge opposite the air bearing surface and first and second laterally opposed sides, the sensor stack including first and second magnetic free layers that are magnetically anti-parallel coupled across a non-magnetic layer sandwiched there-between. The magnetic sensor also includes a novel dielect layer formed at the sides of the sensor stack. The dielectric layer is a material having an ion mill rate that is at least as great as that of the sensor stack and that is passivating to act as an oxygen diffusion barrier to protect the sensor stack. Constructing the dielectric layer of a material that has an ion mill rate similar to or greater than the sensor stack allows the biasing of both magnetic layers to be substantially equal for both magnetic layers. The sensor also includes a magnetic bias structure formed at the back edge of the sensor stack.

The sensor advantageously allows for the bias structure formed behind the back edge of the sensor to extend beyond the sides sensor stack, while also being formed on a substantially flat surface. This allows for improved biasing of the magnetic layers of the sensor stack and allows the biasing of both magnetic layers to be substantially equal for both magnetic layers. Moreover, the first layer insulation can consist of MgO, SiN SiON, or their combination to passivate oxygen from diffusion into the barrier.

The sensor can be formed by a process that includes, depositing a plurality of sensor layers, forming a first mask structure, and performing a first ion milling to remove a portion of the plurality of sensor layers that is not protected by the first mask. A dielectric layer is then deposited, the dielectric material being a material that acts as an oxygen diffusion barrier to prevent oxygen diffusion into the sensor layer. The dielectric layer can be thin. Then, an electrically insulating, non-magnetic fill layer is deposited over the dielectric layer, the electrically insulating, non-magnetic fill layer being a material that is removable by ion milling. Moreover, the dielectric material and fill material have a combined ion mill rate that is similar to that of the sensor stack. This allows the biasing of both magnetic layers to be substantially equal for both magnetic layers. A second mask is then formed, and a second ion milling is performed to remove a portion of the plurality of sensor layers that is not protected by the second mask. A magnetic bias material can be deposited either after the first ion milling or after the second ion milling, depending upon the sensor design.

Because of the ion mill rate of the two fill layer are similar or higher than the sensor, they can be removed at similar rate to the sensor by the ion milling that defines the back edge of the sensor. After the second ion milling has been performed the fill layer can be removed by the second ion milling, allowing the sensor bottom to be fully defined all of the way to the bottom of the free layer. This provides a substantially flatter surface on which to form the bias layer structure than would otherwise be possible.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
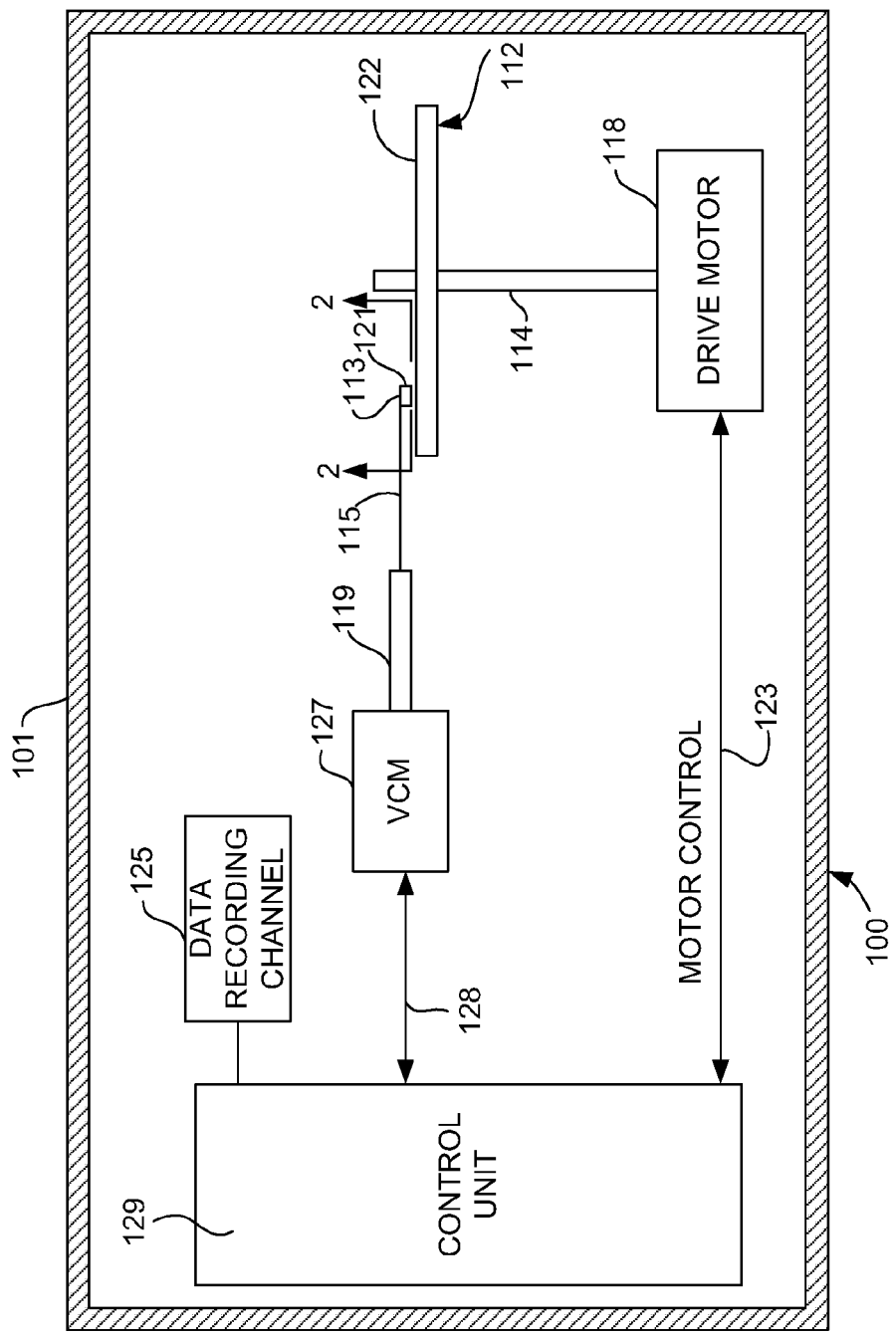
FIG. 1 is a schematic illustration of a disk drive system in which the invention might be embodied.

Referring now to FIG. 1, there is shown a disk drive 100 embodying this invention. The disk drive 100 includes a housing 101. At least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves I in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
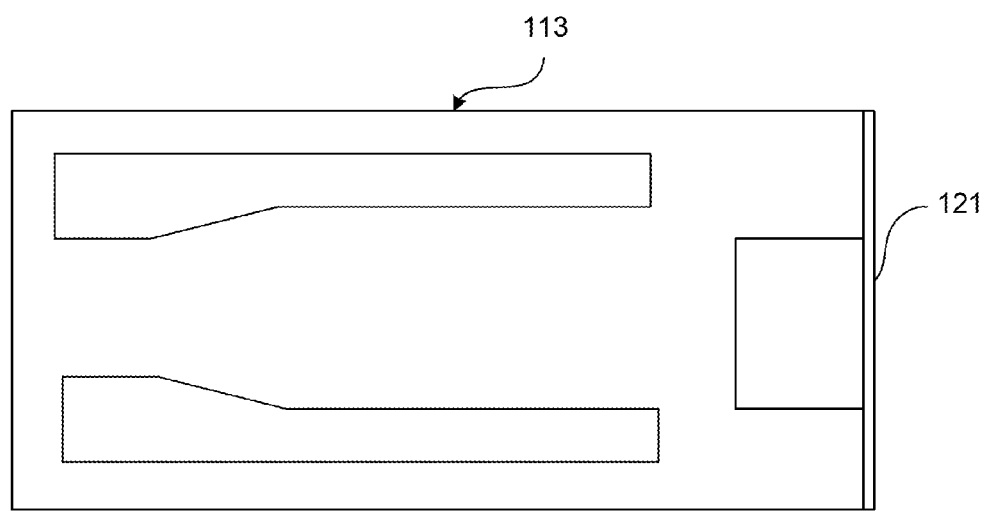
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
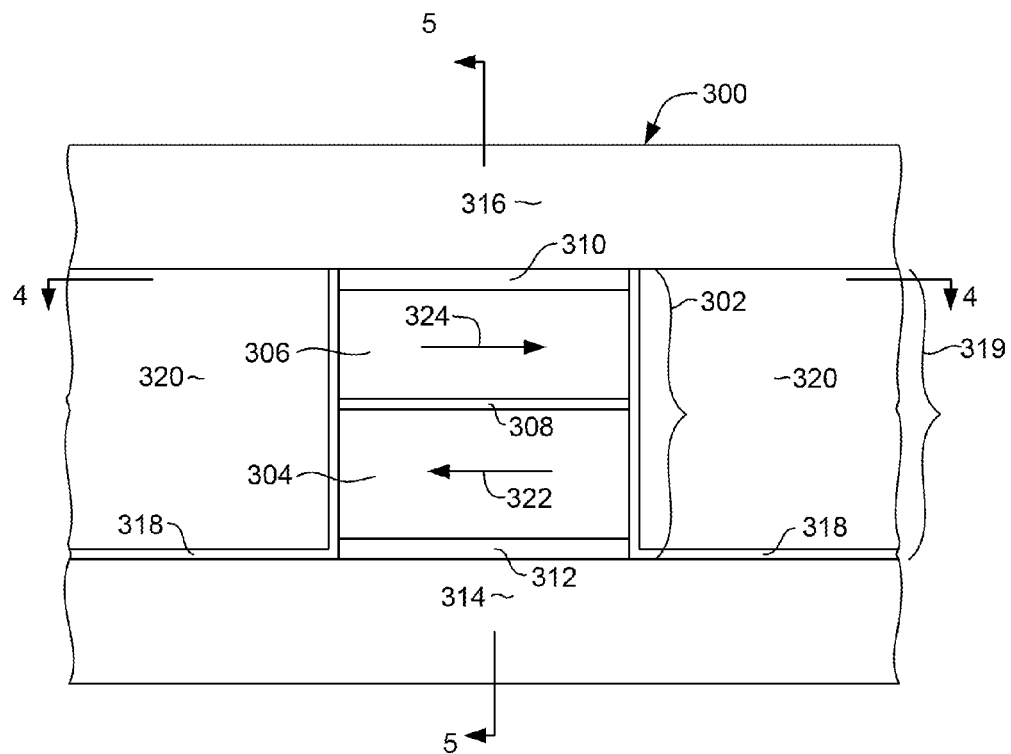
FIG. 3 is an air bearing surface view of a scissor type magnetic read sensor.

FIG. 3 shows a view of a magnetic read head 300 according to a possible embodiment of the invention as viewed from the air bearing surface. The read head 300 is a scissor type magnetoresistive sensor having a sensor stack 302 that includes first and second free layers 304, 306 that are anti-parallel coupled across a non-magnetic layer 308 that can be a non-magnetic, electrically insulating barrier layer such as MgOx or an electrically insulating spacer layer such as AgSn. A capping layer structure 310 can be provided at the top of the sensor stack 302 to protect the layers of the sensor stack during manufacture. The sensor stack 302 can also include a seed layer structure 312 at its bottom to promote a desired grain growth in the above formed layers.

The first and second magnetic layers 304, 306 can be constructed of multiple layers of magnetic material. For example, the first magnetic layer 304 can be constructed of: a layer of Ni—Fe; a layer of Co—Hf deposited over the layer of Ni—Fe; a layer of Co—Fe—B deposited over the layer of Co—Hf; and a layer of Co—Fe deposited over the layer of Co—Fe—B. The second magnetic layer 306 can be constructed of: a layer of Co—Fe; a layer of Co—Fe—B deposited over the layer of Co—Fe; a layer of Co—Hf deposited over the layer of Co—Fe—B; and a layer of Ni—Fe deposited over the layer of Co—Hf. The capping layer structure 310 can also be constructed as a multi-layer structure and can include first and second layers of Ru with a layer of Ta sandwiched there-between. The seed layer structure 312 can include a layer of Ta and a layer of Ru formed over the layer of Ta.

The sensor stack 302 is sandwiched between leading and trailing magnetic shields 314, 316, each of which can be constructed of a magnetic material such as Ni—Fe, of a composition having a high magnetic permeability ($\mu$) to provide effective magnetic shielding. A multi-layer insulation layer 319 is formed at the sides of the sensor stack 302. This can include a thin dielectric layer 318 and a thicker, non-magnetic, electrically insulating fill layer 320 formed over the dielectric layer 318. The first layer 318 is a material that is passivating against oxygen diffusion to protect the sensor, and that has an ion mill rate similar to or higher than that of the sensor, and also has a high dielectric breakdown voltage. To this end, the layer 318 can be MgO, SiN, SiON, of a combination thereof, and is more preferably MgO, which can be deposited by a conformal deposition process such as atomic layer deposition (ALD), chemical vapor deposition (CVD), or ion beam deposition (IBD). The non-magnetic, electrically insulating material 320 is a material that has an ion milling rate that is similar to (or greater than) that of the sensor stack 302 for reasons that will be appreciated further after a discussion of a method for manufacturing a magnetic sensor as discussed below. That is to say, the layer 320 is a material that can be removed by ion milling at a rate that is similar to or greater than the rate at which the layers of the sensor stack 302 would be removed by ion milling. To this end, the layer 320 can be a material such as SiNx, TaOx, MgO SiON, or a combination thereof.

During operation, a sense current or voltage is applied across the sensor stack 302 in a direction perpendicular to the plane of the layers of the sensor stack 302. The shields 314, 316 can be constructed of an electrically conductive material so that they can function as electrical leads for supplying this sense current or voltage across the sensor stack 302. The electrical resistance across the sensor stack 302 depends upon direction of magnetization of the free magnetic layers 304, 306 relative to one another. The closer the magnetizations of the layer 304, 306 are to being parallel to one another the lower the resistance will be, and, conversely, the closer the magnetizations of the layers 304, 306 are to being anti-parallel to one another the higher the resistance will be. Since the orientations of the magnetizations of the layers 304, 306 are free to move in response to an external magnetic field, this change in magnetization direction and resulting change in electrical resistance can be used to detect a magnetic field such as from an adjacent magnetic media (not shown in FIG. 3). The relative orientations of the magnetizations of the layers 304, 306 will be described in greater detail below with reference to FIG. 5. If the non-magnetic layer 308 is an electrically insulating barrier layer, then the sensor operates based on the spin dependent tunneling effect of electrons tunneling through the barrier layer 308. If the layer 308 is an electrically conductive spacer layer, then the change in resistance results from spin dependent scattering phenomenon.

The magnetic layers 304, 306 are anti-parallel coupled across the non-magnetic layer 308. In addition, the layers 304, 306 have a magnetic anisotropy oriented in a direction that is parallel with the air bearing surface. These factors cause the magnetic layers 304, 306 to have magnetizations 322, 324 that would tend to align in opposite directions that are both parallel with the air bearing surface.

Figure 4:
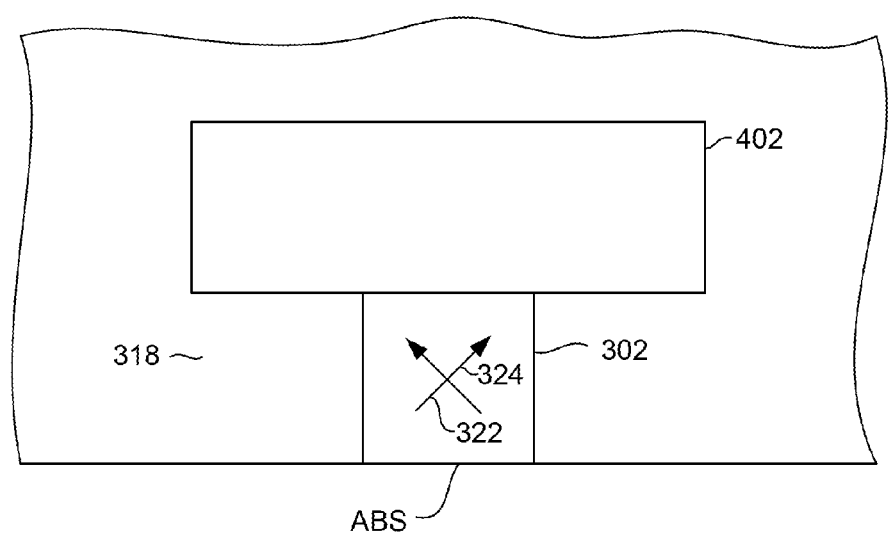
FIG. 4 is a top down view of the scissor type magnetic read sensor as seen from line 4-4 of FIG. 3.

FIG. 4 shows a top down view as seen from line 4-4 of FIG. 3. In FIG. 4 it can be seen that the sensor 300 has a magnetic bias layer structure 402 that is located at a back edge of the sensor stack 302 opposite the air bearing surface ABS. The magnetic bias structure 402 has a magnetization that is oriented perpendicular with the air bearing surface ABS. Therefore, a resulting bias field from the bias structure 402 pulls the magnetizations 322, 324 of the magnetic layers 304, 306 away from being anti-parallel with one another, causing them to be oriented orthogonal to one another. In FIGS. 3 and 4, the magnetization 322 is the magnetization of the magnetic layer 304 and the magnetization 324 is the magnetization of the magnetic layer 306.

However, in order for the bias structure 402 to effectively provide magnetic bias to both layers 304, 306 it is desirable that the bias structure extend across the back edge of both magnetic layers 304, 306. It is also desirable that the bias structure be formed on a relatively flat surface so that it has a thickness in the areas laterally beyond the sensor stack 302 (as seen in FIG. 4) that is similar to the thickness directly behind the sensor stack 302. It is therefore, also desirable that the bias structure be formed on a relatively flat surface.

Figure 5:
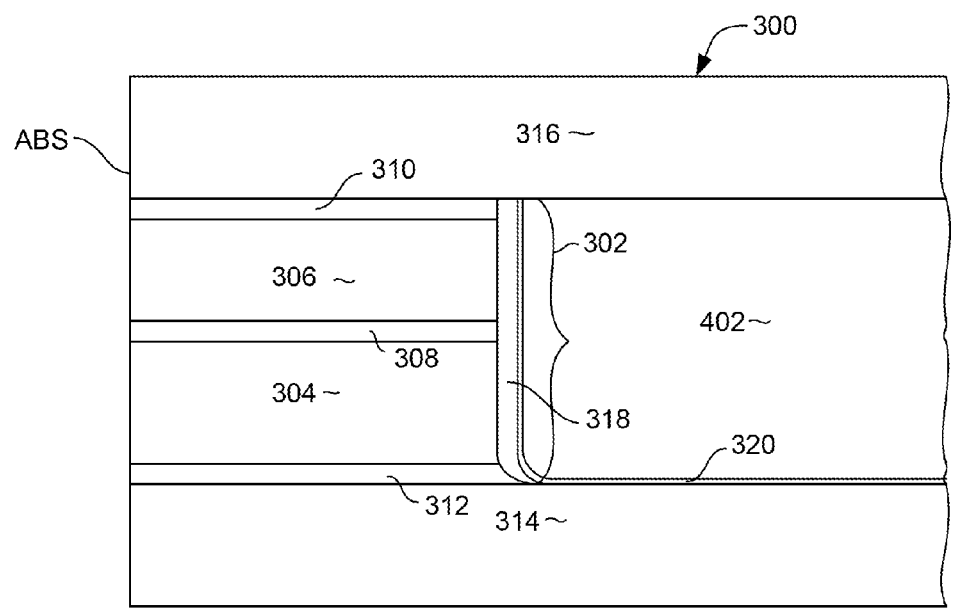
FIG. 5 is a side, cross-sectional view of the sensor of FIGS. 3 and 4 as seen from line 5-5 of FIG. 3.

FIG. 5 shows a view as seen from line 5-5 of FIG. 3. As seen in FIG. 5, the bias structure is formed behind dielectric layer 318. This dielectric layer 318 is relatively thin but is thick enough to that electrical sense current will not be shunted through the sensor stack 302. The dielectric layer 318 can be a material such as MgO, SiN, SiON, or a combination thereof.

Figure 6:
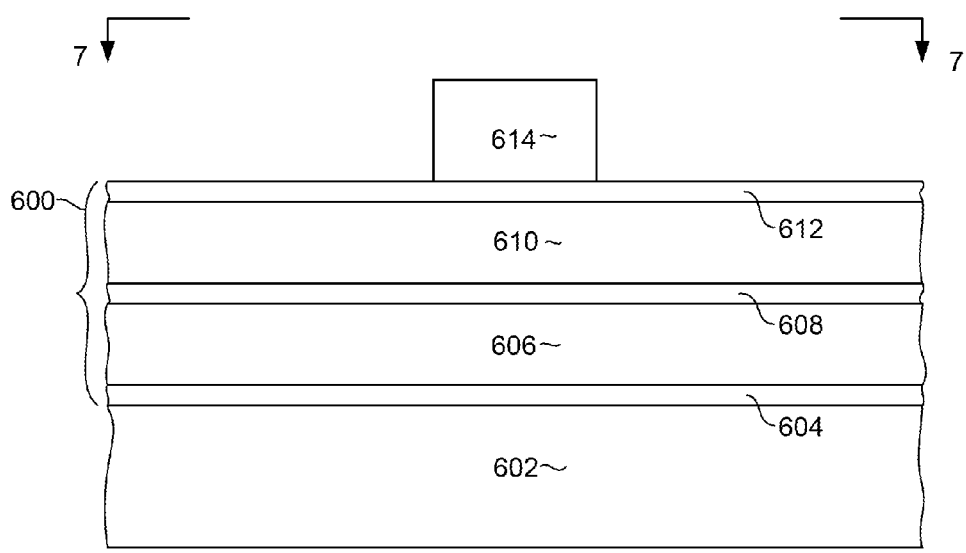
FIGS. 6-22 are views of a magnetic sensor in various intermediate stages of manufacturing, illustrating a method for manufacturing a scissor type magnetic read sensor.

The advantage of the novel multi-layer dielectric and fill layer structure 318 can be better understood with reference to FIGS. 6-22, which illustrate a method for manufacturing a magnetic sensor according to an embodiment of the invention. With particular reference to FIG. 6 a bottom shield/lead layer 602 is formed, and a plurality of sensor layers 600 is deposited over the shield 602. The series of sensor layers 600 can include a seed layer 604, first magnetic layer 606, non-magnetic spacer or barrier layer 608, second magnetic layer 610 and a capping layer 612. These layers 604, 606, 608, 610, 612 can be constructed of the materials discussed above with reference to FIG. 3.

Figure 7:
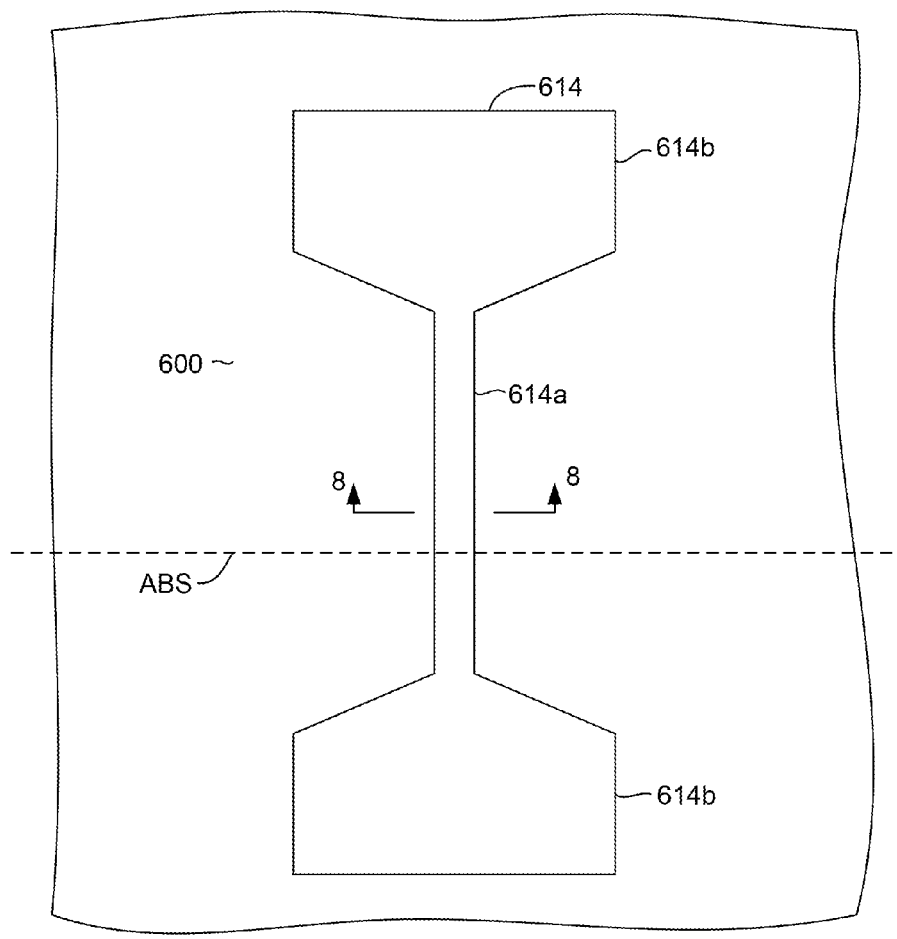

After the series of sensor layers 602 is deposited, a first mask structure (track-width defining mask structure 614 is formed over the series of sensor layers 614. The configuration of the mask 614 can be better understood with reference to FIG. 7, which shows a top-down view as seen from line 7-7 of FIG. 6. As seen in FIG. 7, the mask 614 has a central portion 614a that has a width that is configured to define a sensor track width. The mask 614 also has relatively larger anchor pads 614b at each end in order to ensure proper adhesion of the mask 614 to the under-lying sensor layers 600. The location of the air bearing surface plane is indicated by the dashed line denoted ABS.

Figure 8:
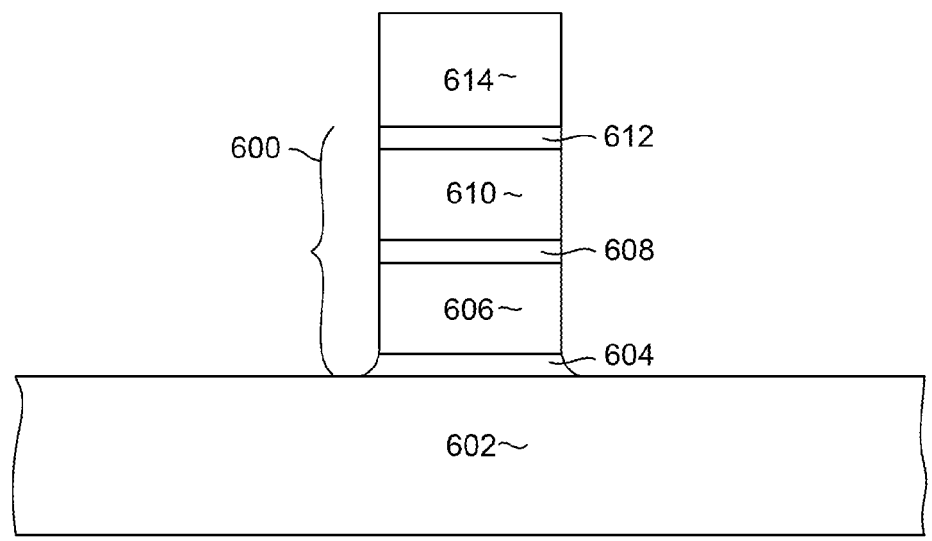

After the mask 614 has been formed, an ion milling is performed to remove portions of the sensor material 602 that are not protected by the mask 614. This results in a structure as seen in FIG. 8, which is a cross sectional view of a plane that is parallel with the ABS plane, as seen from line 8-8 of FIG. 7.

Figure 9:
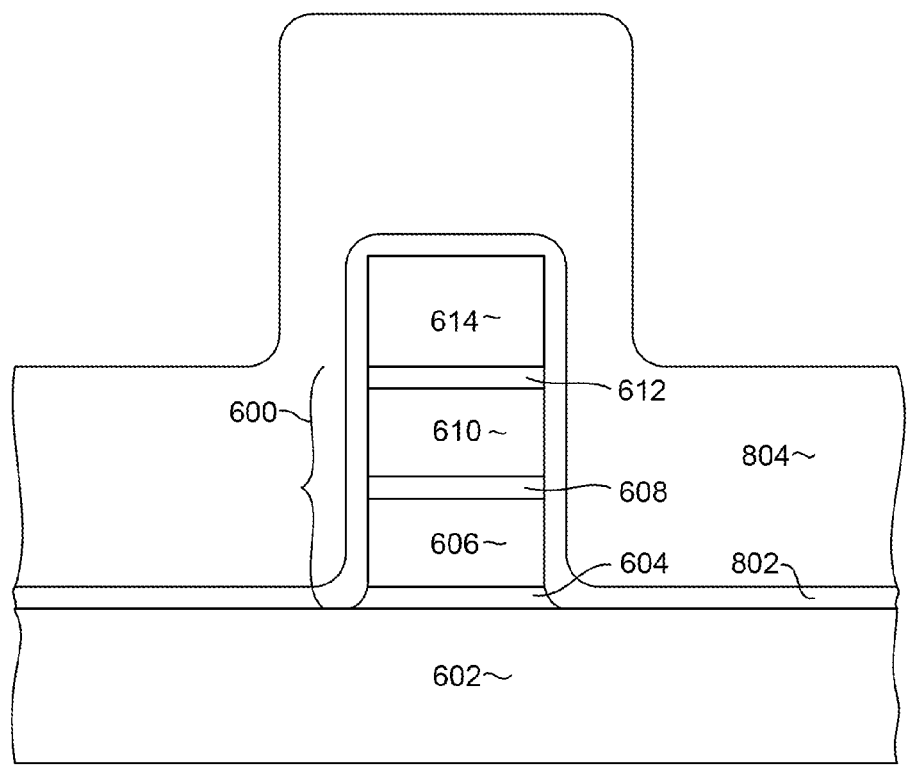
Figure 10:
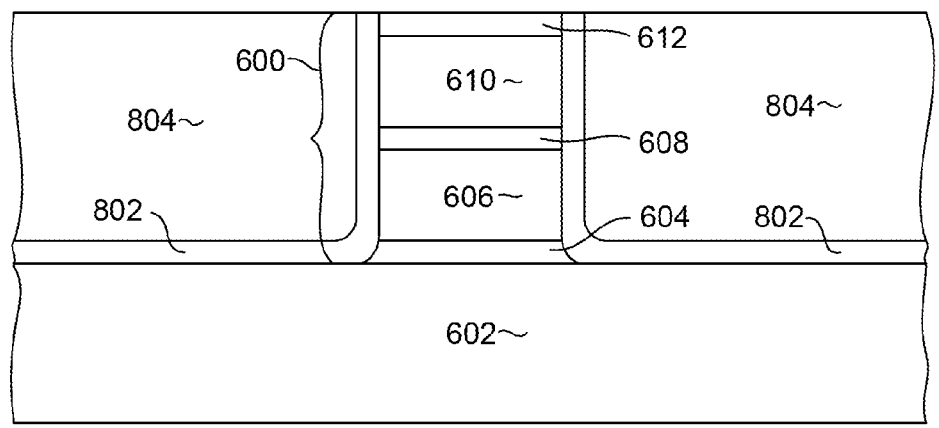

Then, with reference to FIG. 9, a relatively thin dielectric layer 802 is deposited followed by a thicker non-magnetic, electrically insulating fill layer 804. The layers 802 and 804 are constructed of materials that have an ion mill rate that is the same as or greater than that of the layers of the sensor stack 302. That is, the layers 802, 804 are constructed of materials that will be removed by ion milling at a rate that is the same as or greater than the rate at which the sensor layers 602 would be removed by ion milling. To this end, the dielectric layer 802 can be a material such as TaOx, MgO, SiN, SiON, or combinations thereof (preferably MgO). The fill layer 804 can be a material such as such as as SiyNx, TayOx, MgO SiON, or a combination thereof. The layer 804 is more preferably TaOx. After deposition of the layers 802, 804, a chemical mechanical polishing (CMP) can be performed to remove the mask 614, planarize the structure and expose the sensor layers 600, leaving a structure as shown in FIG. 10. An optional CMP stop layer such as carbon (not shown) can be deposited prior to performing the CMP, and later removed by reactive ion etching.

Figure 11:
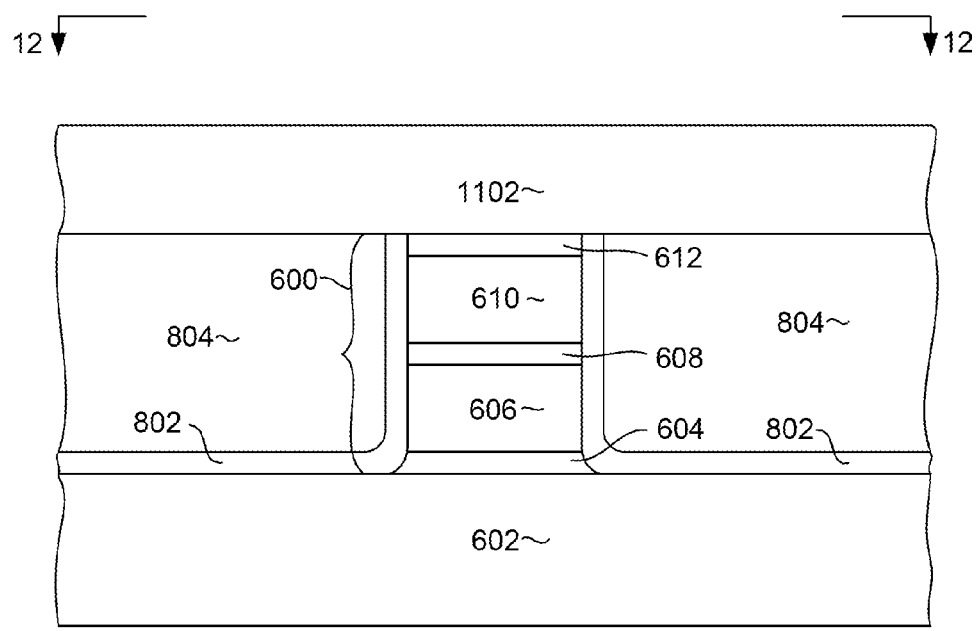
Figure 12:
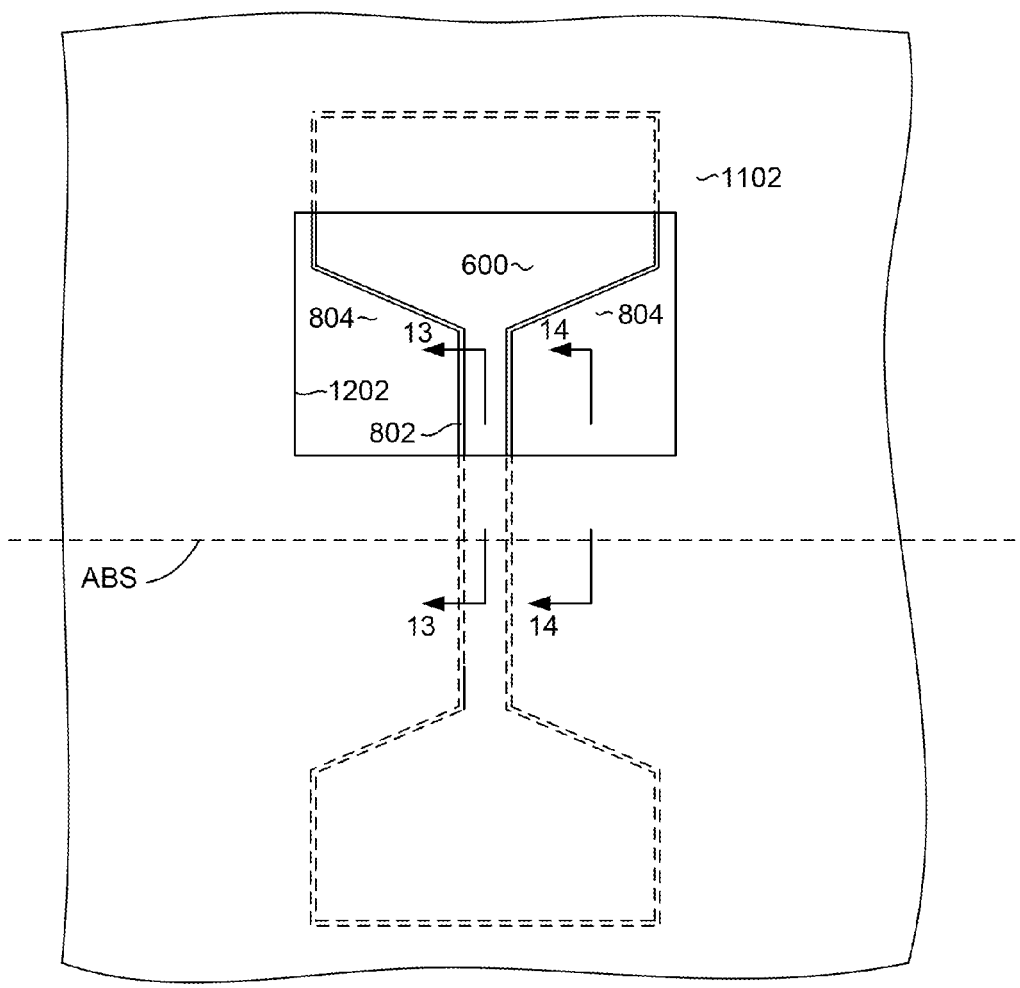

With reference now to FIGS. 11 and 12, a second mask structure (stripe height defining mask structure) 1102 is formed over the sensor layers 600 and layers 802, 804. FIG. 12 shows a top-down view as seen from line 12-12 of FIG. 11. The mask 1102 has an opening 1202 that is configured to define both a back edge (stripe height) of a sensor as well as a magnetic bias structure as will be seen. In FIG. 12, the structures hidden beneath the mask 1102 are shown in dashed line, while the areas shown in solid line are exposed through the opening 1202 in the mask 1102.

Figure 13:
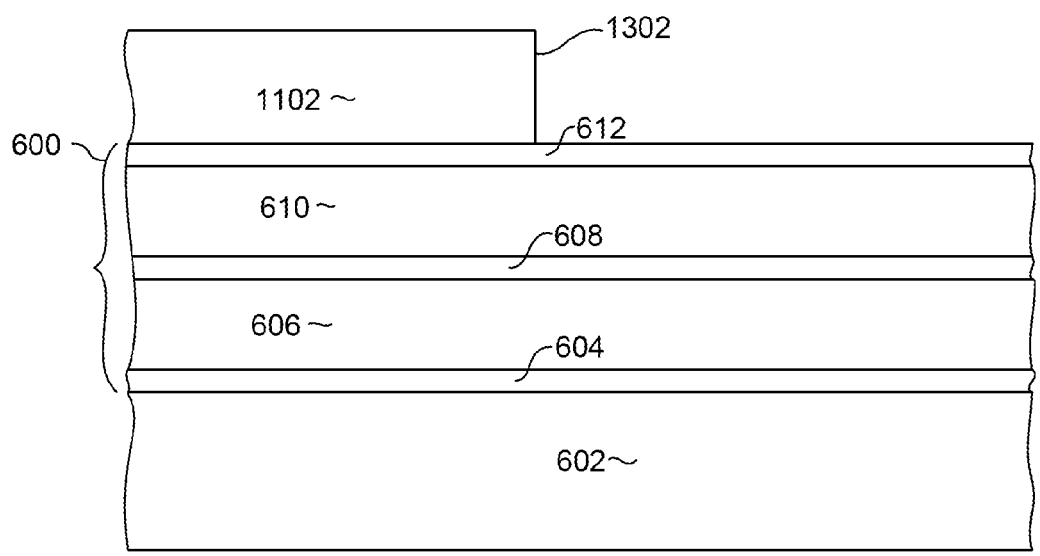
Figure 14:
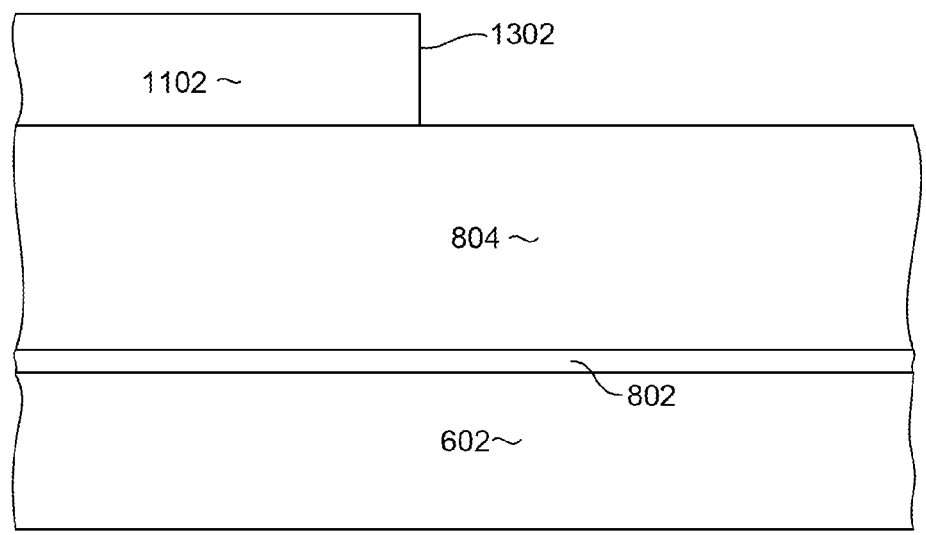
Figure 15:
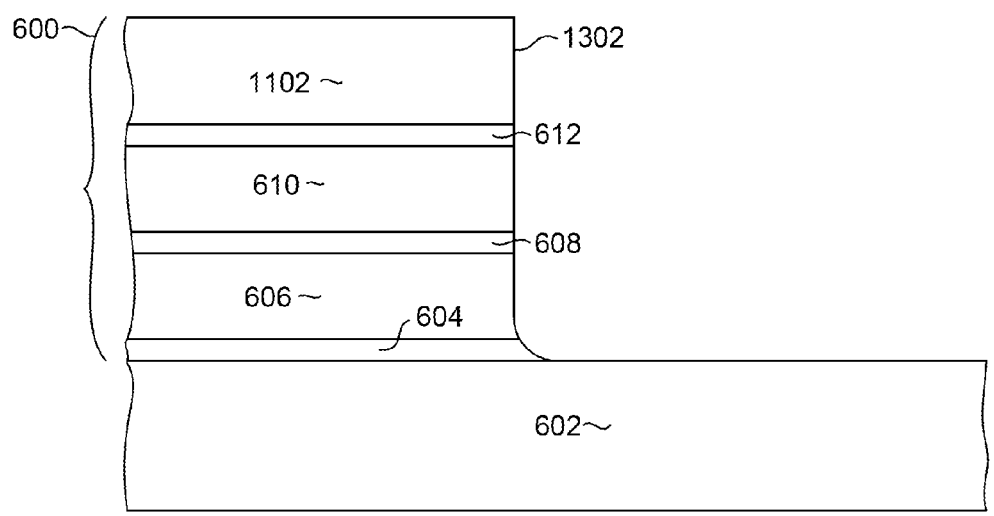
Figure 16:
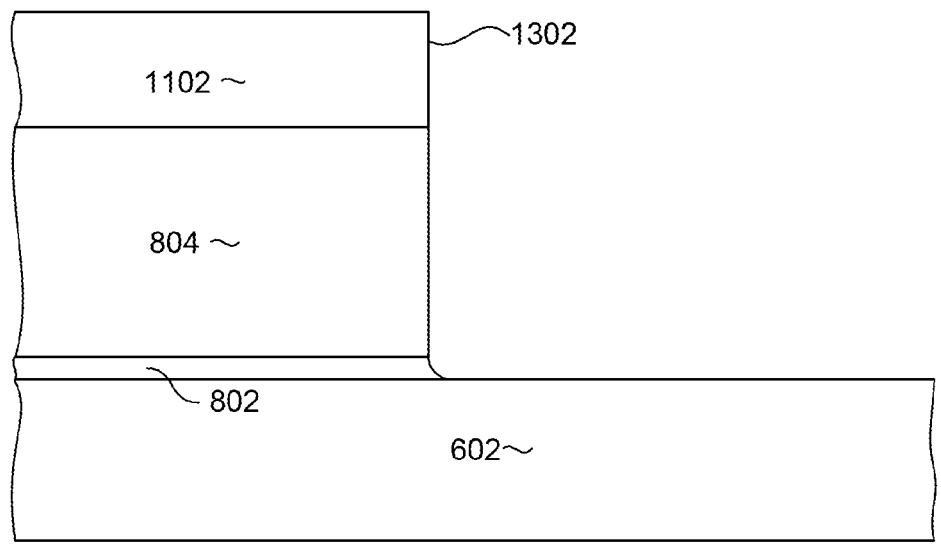
Figure 17:
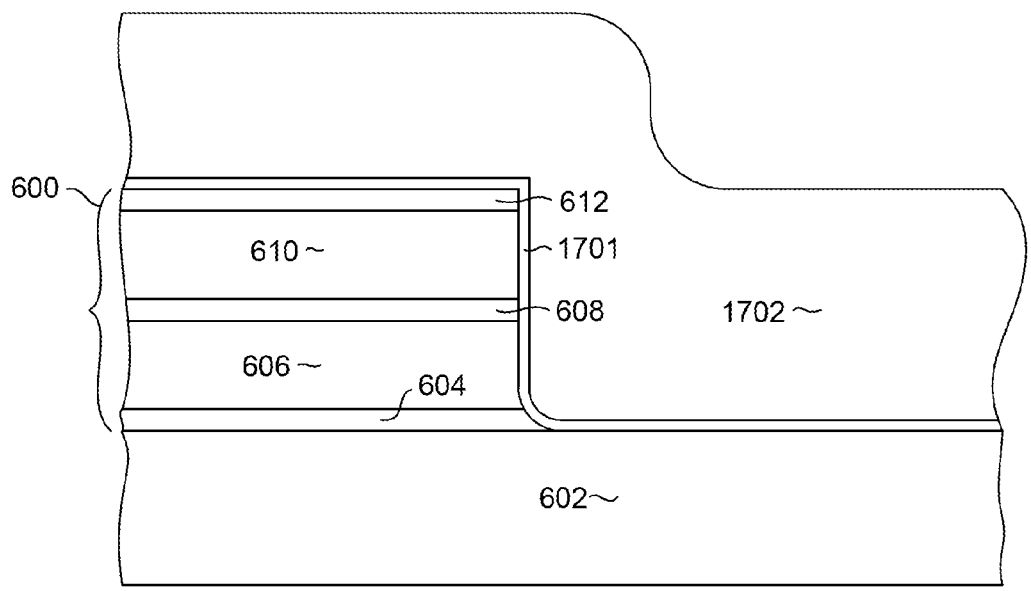
Figure 18:
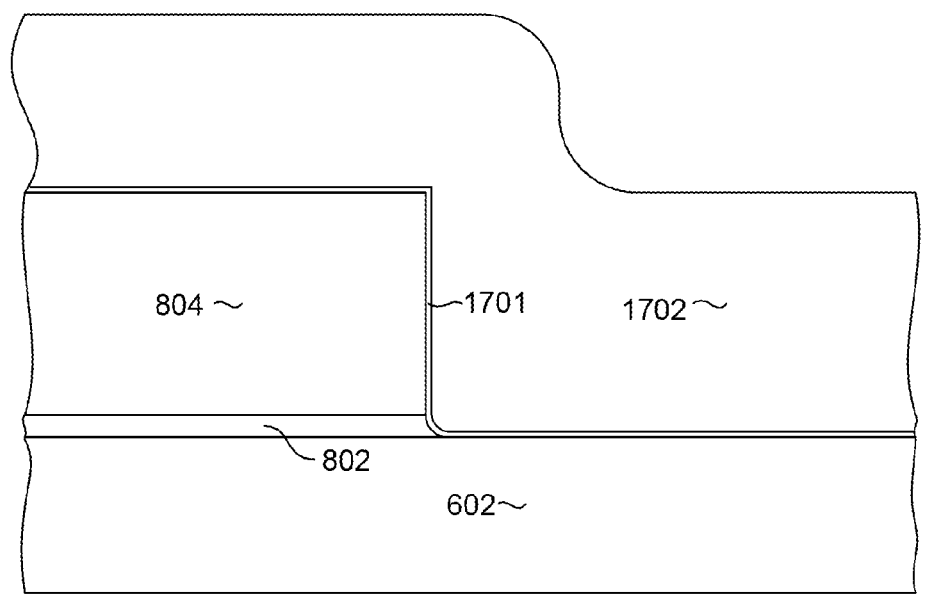

FIG. 13 shows a side cross sectional view taken within the area of the sensor stack 602 as seen from line 13-13 of FIG. 12, whereas FIG. 14 shows a side, cross sectional view of an area laterally outside of the sensor area as seen from line 14-14 of FIG. 12. As can be seen in FIGS. 13 and 14, the mask 1102 has a back edge 1302 that defines a sensor stripe height. After the mask 1102 has been formed, a second ion milling is performed to remove material not protected by the mask 1102, leaving a structure as shown in FIGS. 15 and 16, where FIG. 15 is at the same location as FIG. 13 and FIG. 16 is at the same location as FIG. 14. In FIGS. 15 and 16, it can be seen that the ion milling removes all of the sensor material 602 behind the back edge 1302 of the mask 1102 (FIG. 15) and also removes all of the fill layer 804 and dielectric layer 802 behind the back edge 1302 of the mask 1102 (FIG. 16), stopping on the shield layer 602. It will be recalled that the dielectric layer 802 and the fill layer 804 are materials that have the same (or greater) ion milling rate as the sensor layers 600 (or 302 in FIG. 3). This advantageously allows all of the dielectric layer 802 and all of the fill layer 804 to be removed, ensuring that both sensor free layers 606, 610 are clearly defined for optimal alignment with the biasing material. With reference now to FIGS. 17 and 18, a layer of dielectric material 1701 that is passivating against oxygen diffusion to protect the sensor 600 and that also has a high dielectric breakdown voltage is deposited, followed by a magnetic bias material 1702. The dielectric material 1701 can be MgO, SiN, SiON, or a combination thereof, and is more preferably MgO.

Figure 19:
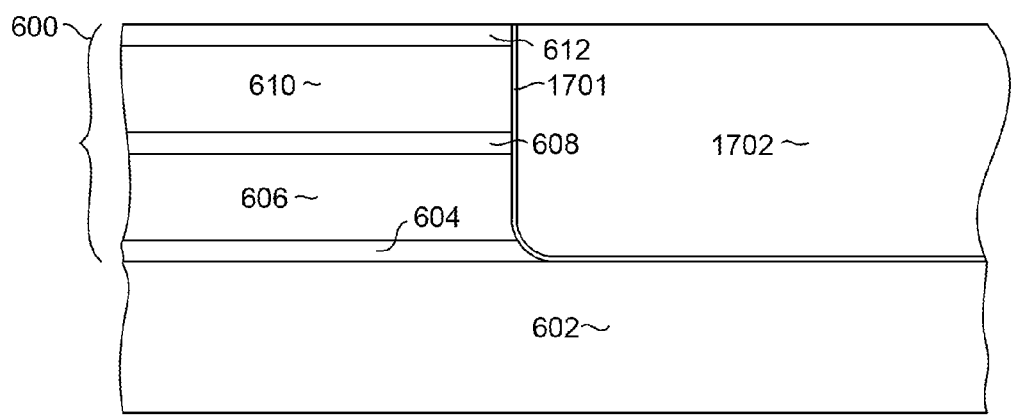

FIG. 17 is a view in the sensor area at the location of FIGS. 15 and 13, and FIG. 18 is a view in the outer area at the location of FIGS. 14 and 16. The magnetic bias material layer 1702 can be a material having a high magnetic coercivity such as CoPt, CoPtCr or a combination of these and NiTa/CrMo underlayer and nonmagnetic cap, or could also be a soft magnetic material that could be exchange coupled with a layer of anti-ferromagnetic material such as IrMn (not shown). A chemical mechanical polishing can then be performed to planarize the structure, leaving a structure as shown in FIGS. 19 and 20.

Figure 20:
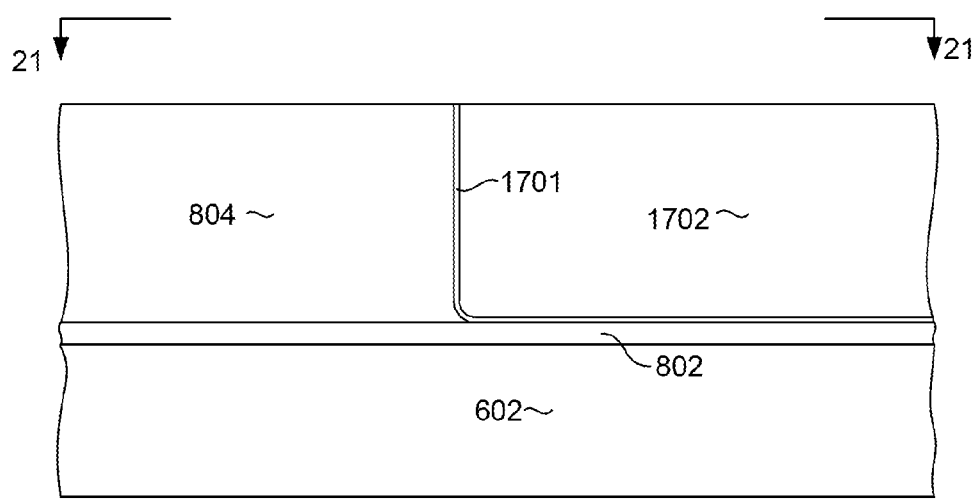

From the above it can be seen that, because the dielectric layer 802 and the fill layer 804 have substantially the same (or greater) ion milling rate as the sensor layers 602 and were completely removed by the second ion milling, the bias structure 1702 can be thick even in areas laterally removed from the sensor 602 (such as the area shown in FIG. 20. This ensures that both of the magnetic layers 606 and 610 will have excellent, and substantially equal magnetic biasing. In addition, the bias structure 1702 can be deposited over a substantially flat surface both within the sensor area and outside of the sensor area.

Figure 21:
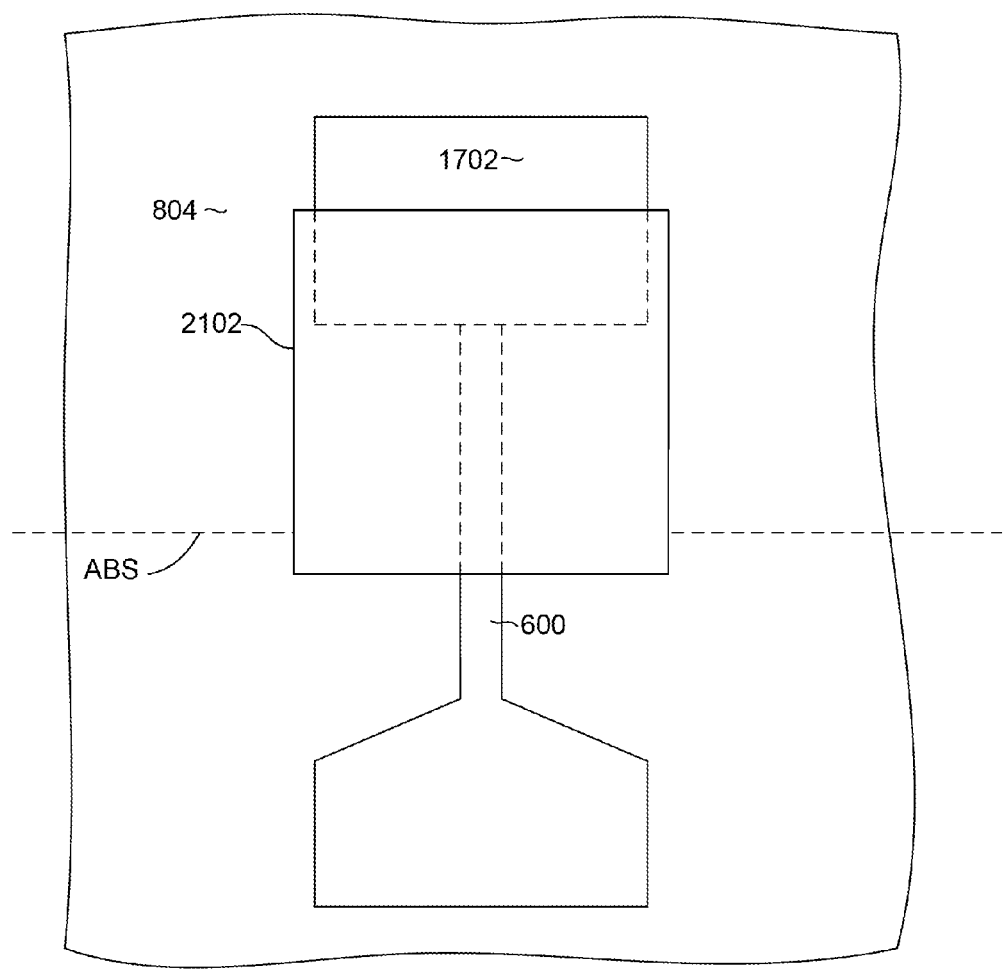
Figure 22:
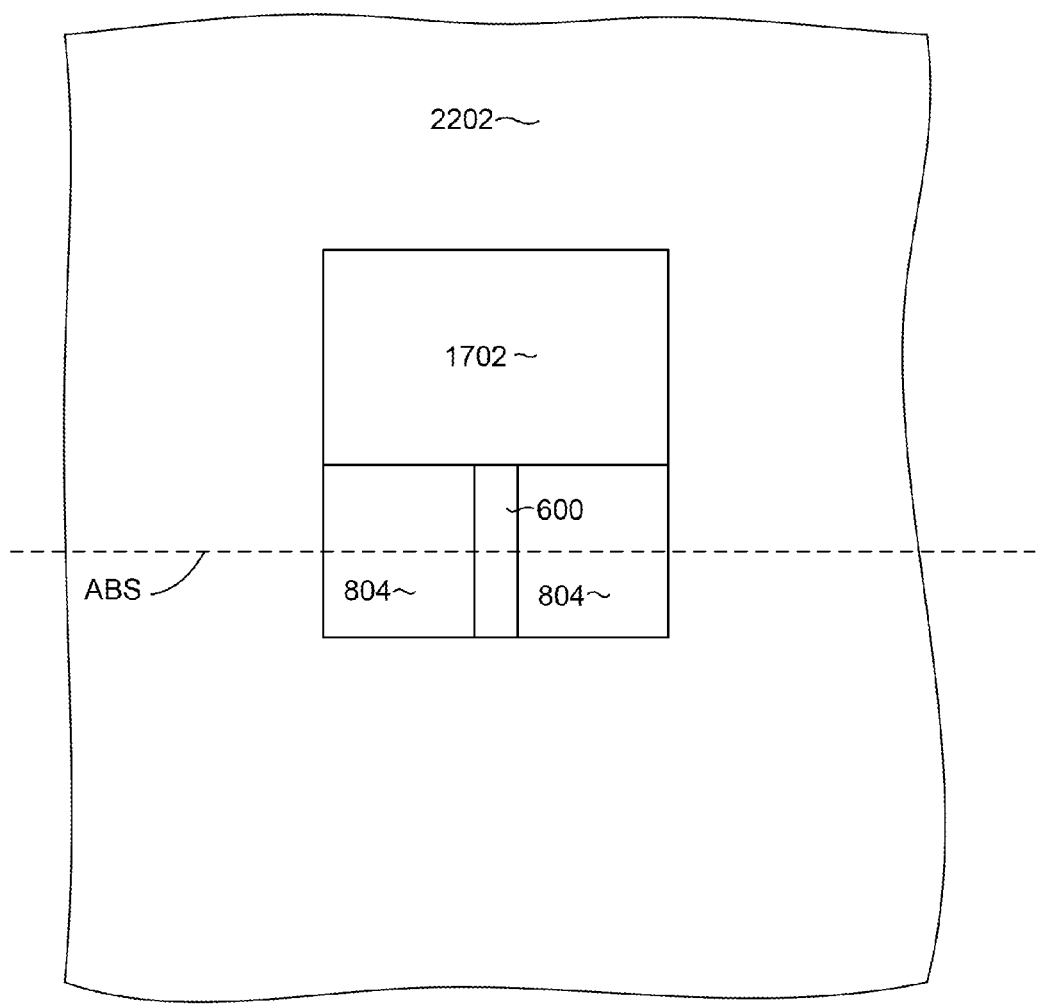

With reference now to FIG. 21, another mask structure 2102 is formed that is configured to cover the sensor area and most of the bias layer, leaving an outer field region exposed. Another ion milling can then be performed to remove exposed material in the field. Then, another fill layer such as alumina 2202 can be deposited, and another chemical mechanical polishing and mask removal can be performed, leaving a structure as shown in FIG. 22.

In the above described process the track-width of the sensor is defined first, followed by the definition of the sensor stripe height and back edge bias structure. However, the process does not necessarily have to proceed in this order. The sensor can also be constructed by defining the stripe height and back edge bias structure first, followed by definition of the track-width of the sensor. Such an order of operations could be useful for accommodating different design considerations, such as the inclusion of soft magnetic side shields at the sides of the sensor.

Figure 23:
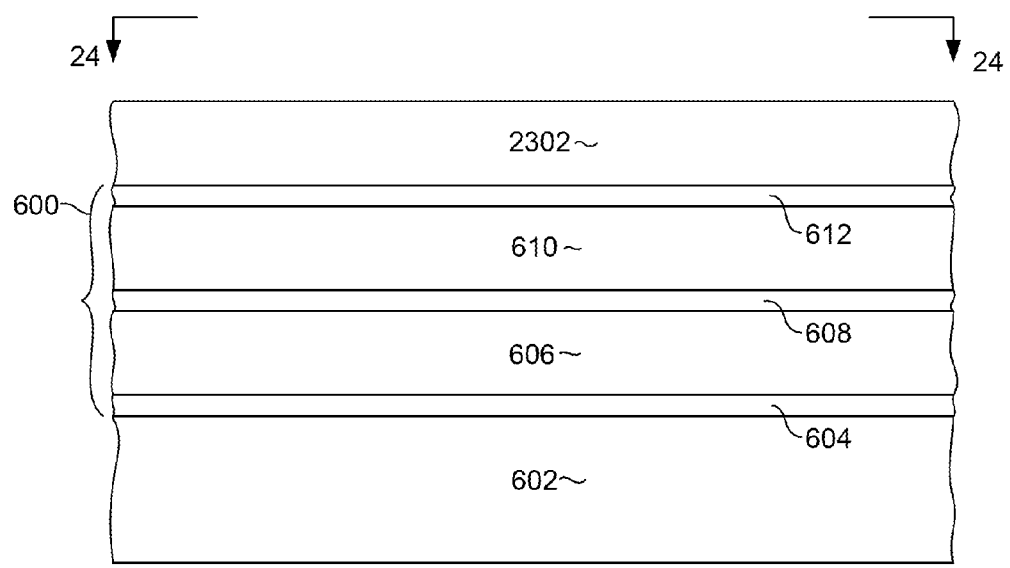
FIGS. 23-29 are views of a magnetic sensor in various intermediate stages of manufacture, illustrating a method for manufacturing a scissor type magnetic read sensor according to another embodiment of the invention.

To this end, FIGS. 23-29 illustrate a process for manufacturing a magnetic sensor wherein the sensor stripe height is defined first, followed by the track-width. This order of construction can be particularly useful for constructing a sensor having soft magnetic side shields, as will be seen. With particular reference to FIG. 23, a bottom magnetic shield 602 is formed and a series of sensor layers 600 are deposited over the shield 602. The sensor layers 600 can include: a seed layer 604 formed over the shield 602; a first magnetic free layer 606 formed over the seed layer 604; a non-magnetic spacer or barrier layer 608 formed over the first magnetic layer 606; a second magnetic layer free 610 formed over the non-magnetic layer 608; and a capping layer 612 formed over the second magnetic free layer 610.

Figure 24:
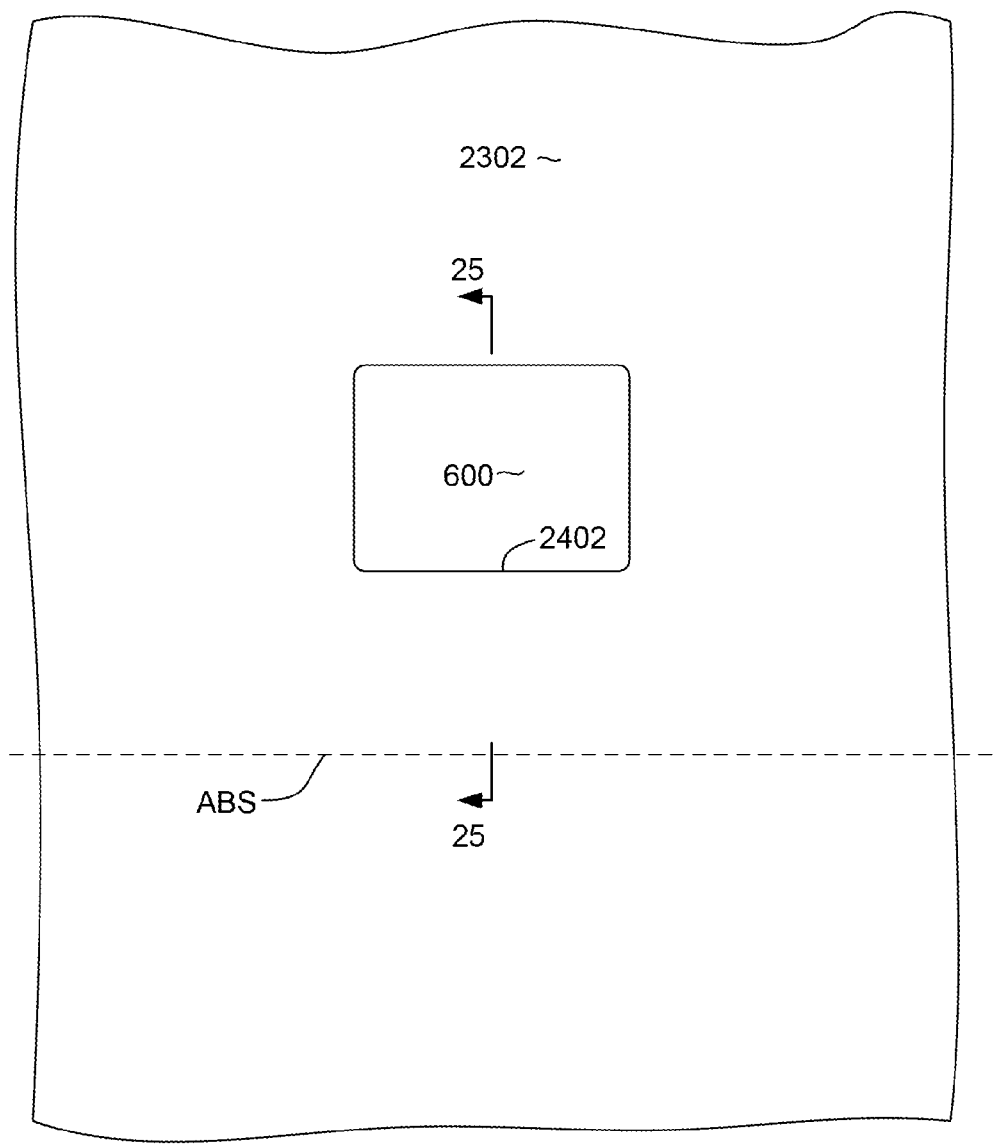

A mask 2302 is formed over the sensor layers 600. The configuration of the mask 2302 can be understood more clearly with reference to FIG. 24, which shows a top down view as seen from line 24-24 of FIG. 23. In FIG. 24 it can be seen that the mask 2302 has an opening that has an edge 2402 located a desired distance from an air bearing surface plane indicated by dashed line denoted as ABS. The opening in the mask 2302 determines the location of a sensor back edge and also the location of a back edge magnetic bias structure relative to the air bearing surface plane ABS as will be seen.

Figure 25:
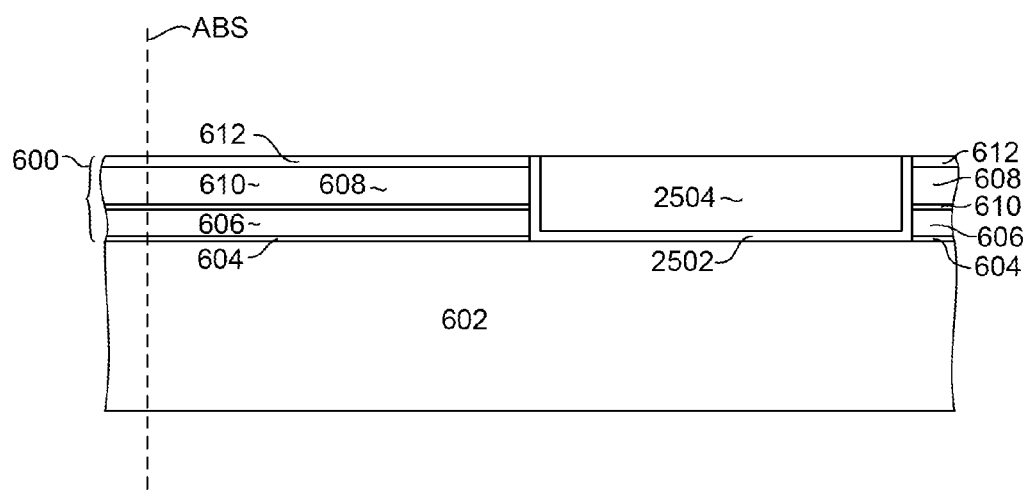

With mask 2302 in place, an ion milling is performed to remove portions of the sensor material 600 that are exposed through the opening in the mask. A dielectric layer 2502 is then deposited and a magnetic bias material 2504 is deposited over the bias material. A planarization process can then be performed, leaving a structure as shown in FIG. 25, which is a side cross sectional view as seen from line 25-25 of FIG. 24. The dielectric layer 2502 is material having an ion mill rate that is the same as or greater than that of the sensor material 600, and which also has a high electrical breakdown voltage and which is passivating against oxygen. To this end, the dielectric layer 2502 can be constructed of MgO, SiN, SiON, or a combination thereof, and is more preferably MgO.

Figure 26:
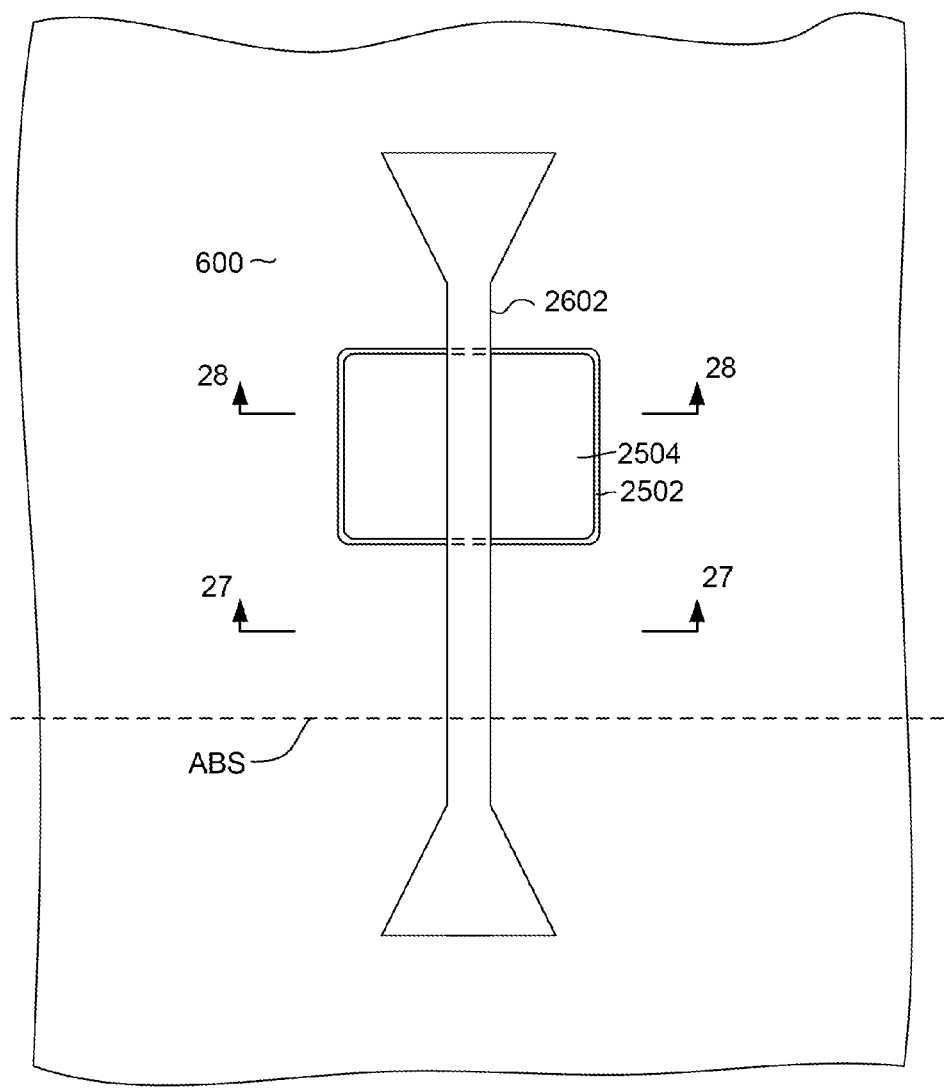

With reference now to FIG. 26, which is a top down view, a second mask 2602 is formed. This mask 2602 is configured to define a sensor track-width. As can be seen, the mask 2602 extends over an area between the bias structure 2504 and also over an area between the ABS plane and the bias structure 2504. With the mask 2602 in place, an ion milling can be performed to remove portions of the sensor material 600 that are not protected by the mask, and also to remove portions of the bias structure 2504 and dielectric layer 2502 that are not protected by the mask 2602.

Figure 27:
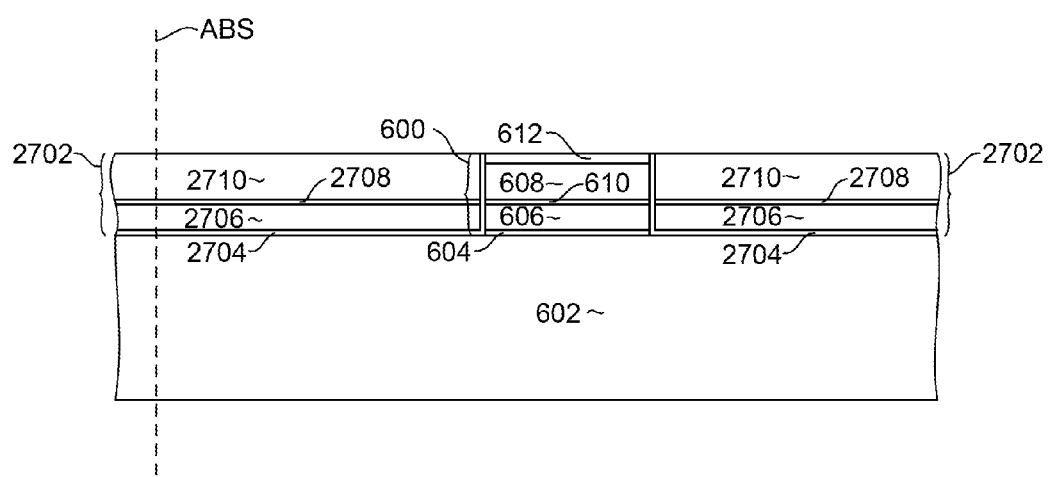
Figure 28:
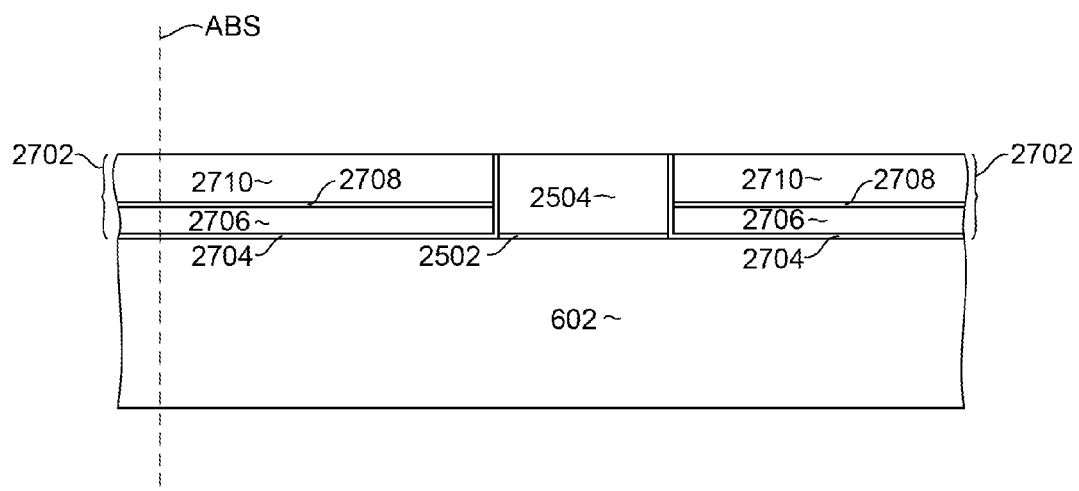

FIG. 27 shows a cross sectional view taken at the location of line 27-27 of FIG. 26, and FIG. 28 is a view taken from line 28-28 of FIG. 26. As shown in FIGS. 27 and 28, after the ion milling has been performed, a soft magnetic side shield structure 2702 can be deposited and a chemical polishing can be performed to planarize the structure, leaving a structure as shown in FIGS. 27 and 28. The deposition of the soft magnetic side shield structure 2702 can include depositing a dielectric layer 2704, depositing a first magnetic layer 2706, depositing a non-magnetic coupling layer 2708 and depositing a second magnetic layer 2710. Like the previously deposited dielectric layer 2504, the dielectric layer 2704 can be a material having the same or greater ion milling rate as that of the sensor layers 600. To this end, the dielectric layer 2704 can be constructed of MgO, SiN, SiON, or a combination thereof, and is more preferably MgO.

It will be recalled that the dielectric 2502, which extends beneath the bias structure 2504 has the same or greater ion milling rate as the sensor layers 600. This means that the previously performed ion milling can remove all of the dielectric layer 2502 so that the ion milling can progress all of the way down to the bottom shield 602. This leaves a smooth uniform surface on which to form the side shield structure 2702. This also means that the thickness of the side shield 2702 is the same the location of FIG. 27 (at the location of the sensor 600) as it is at the location of FIG. 28 (at the location of the bias structure 2504).

Figure 29:
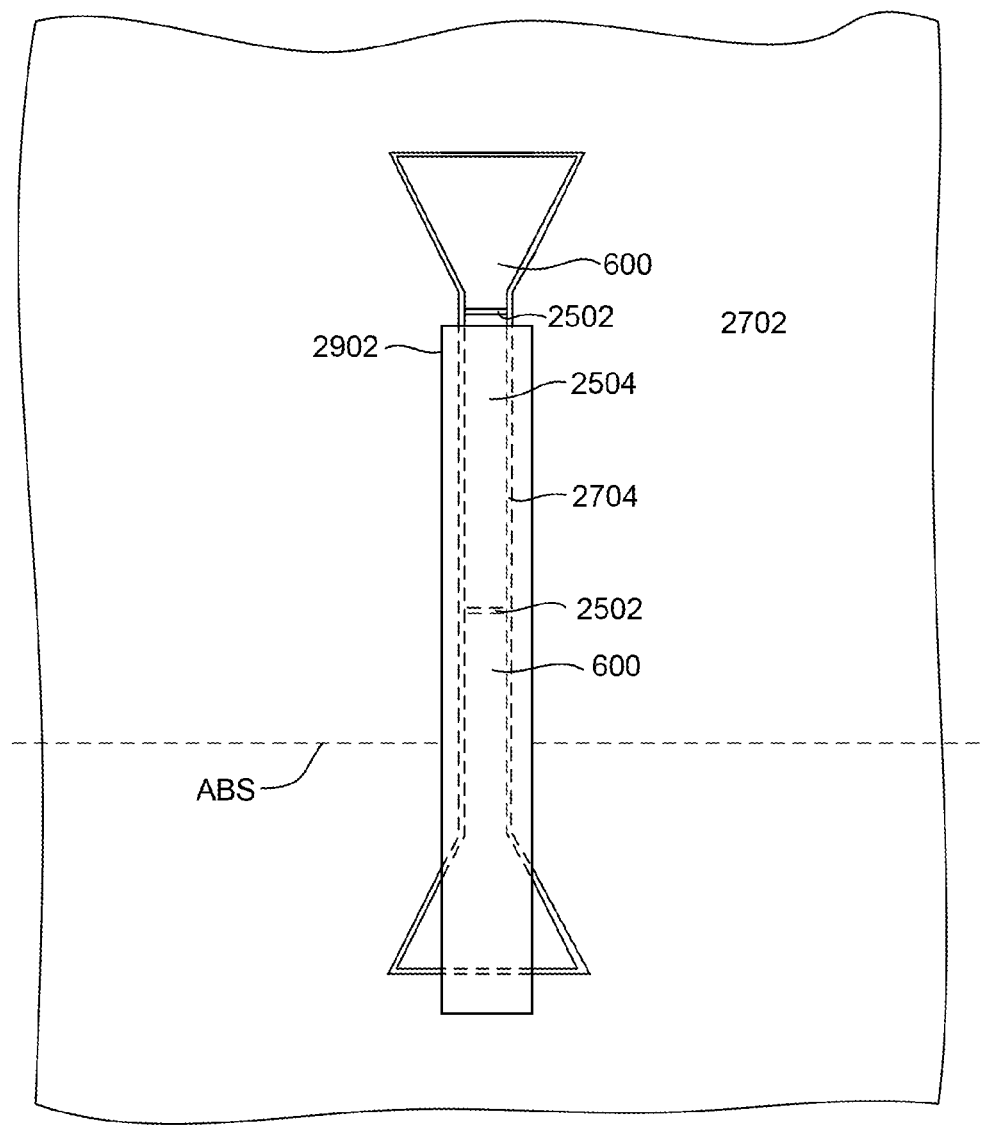

Finally, with reference to FIG. 29 another mask structure 2902 is formed. This mask 2902 is configured to define the outer dimensions of the side shields 2702 and bias structure 2504. After the mask 2902 is formed, an ion milling can be performed to remove material not protected by the mask 2902. A non-magnetic fill layer can then be deposited and another planarization process such as chemical mechanical polishing can be performed. As can be seen in FIG. 29, the above process results in side shields 2702 that extend beyond the stripe height of the sensor and alongside the bias structure 2504. In addition, it can be seen that the bias structure 2504 has a width that is self aligned with the sensor.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

The invention claimed is:

1. A magnetic sensor, comprising:
    a sensor stack having a front edge located at an air bearing surface a back edge opposite the air bearing surface, and first and second laterally opposed sides, the sensor stack including first and second magnetic free layers that are magnetically anti-parallel coupled across a non-magnetic layer sandwiched there-between;
    an insulation layer formed at the sides of the sensor and back edge of the sensor, the insulation layer being a material having an ion milling rate that is at least as great as that of the sensor stack the insulation layer being thicker at the sides of the sensor than at the back edge of the sensor; and
    a magnetic bias structure formed at the back edge of the sensor stack over the insulation layer.

2. The magnetic sensor as in claim 1, wherein the insulation layer is a bi-layer insulation structure comprising a first layer and a second layer formed over the first layer, and wherein the second layer and second layers are much thicker at the sides of the sensor than it is a the back edge of the sensor.

3. The magnetic sensor as in claim 1, wherein the insulation layer comprises a first layer comprising one or more of MgO, SiN and SiON and a second layer comprising one or more of SiNx, TaOx, MgO and SiON.

4. The magnetic sensor as in claim 1 wherein the insulation layer comprises one or more of MgO, SiN and SiON.

5. The magnetic sensor as in claim 1, wherein the insulation layer comprises MgO.

6. The magnetic sensor as in claim 1, wherein the insulation layer comprises one or more of MgO, SiN and SiON and wherein the soft magnetic bias structure is formed over the insulation layer.

7. The magnetic sensor as in claim 1, wherein the magnetic bias structure extends laterally beyond the first and second sides of the sensor stack.

8. The magnetic sensor as in claim 1, wherein the magnetic bias structure has a width that is aligned with the sensor stack.

9. The magnetic sensor as in claim 1, wherein the magnetic bias structure has a width that is self aligned with the sensor stack and wherein the sensor further comprises a soft magnetic side shield structure formed over the insulation layer and extending beyond a back edge of the sensor stack.

* * * * *